(12) United States Patent
Choi et al.

(10) Patent No.: US 10,129,982 B2
(45) Date of Patent: Nov. 13, 2018

(54) EMBEDDED BOARD AND METHOD OF MANUFACTURING THE SAME

(71) Applicant: SAMSUNG ELECTRO-MECHANICS CO., LTD, Suwon-Si, Gyeonggi-Do (KR)

(72) Inventors: Jae Hoon Choi, Suwon-Si (KR); Jung Hyun Park, Suwon-Si (KR); Yong Ho Baek, Suwon-Si (KR); Hea Sung Kim, Suwon-Si (KR); Jung Hyun Cho, Suwon-Si (KR); Il Jong Seo, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/815,868

(22) Filed: Jul. 31, 2015

(65) Prior Publication Data
US 2016/0105967 A1    Apr. 14, 2016

(30) Foreign Application Priority Data
Oct. 13, 2014   (KR) .......................... 10-2014-0137636

(51) Int. Cl.
| | |
|---|---|
| *H05K 3/30* | (2006.01) |
| *H05K 1/18* | (2006.01) |
| *H05K 3/00* | (2006.01) |
| *H05K 3/46* | (2006.01) |

(52) U.S. Cl.
CPC ............ *H05K 1/183* (2013.01); *H05K 1/185* (2013.01); *H05K 3/306* (2013.01); *H05K 3/4697* (2013.01); *H05K 3/0097* (2013.01); *H05K 3/305* (2013.01); *H05K 3/4682* (2013.01); *H05K 2201/10015* (2013.01); *H05K 2201/10636* (2013.01); *H05K 2203/1536* (2013.01); *Y02P 70/611* (2015.11)

(58) Field of Classification Search
CPC ............................... H05K 3/306; H05K 1/183
See application file for complete search history.

(56) References Cited

U.S. PATENT DOCUMENTS

| | | | |
|---|---|---|---|
| 7,886,433 B2 | 2/2011 | Bae et al. | |
| 2006/0131729 A1* | 6/2006 | Lee | ...................... H01L 21/4803 257/700 |
| 2007/0074900 A1* | 4/2007 | Lee | ......................... H05K 1/185 174/260 |
| 2012/0037404 A1* | 2/2012 | Hsu | ................... H01L 23/49822 174/252 |

FOREIGN PATENT DOCUMENTS

| | | |
|---|---|---|
| TW | 201204204 A | 1/2012 |
| WO | 2014/118916 A1 | 8/2014 |

OTHER PUBLICATIONS

English translation of Chinese Office Action issued in Application No. 201510591386.2 dated Oct. 10, 2017.

\* cited by examiner

*Primary Examiner* — Jeremy C Norris
(74) *Attorney, Agent, or Firm* — McDermott Will & Emery LLP

(57) ABSTRACT

An embedded board includes an insulating layer and an electronic device embedded in the insulating layer. A first circuit pattern is embedded to contact a bottom surface of the insulating layer, and a second circuit pattern protrudes from the bottom surface of the insulating layer. A via is bonded to the device and the second circuit pattern.

27 Claims, 10 Drawing Sheets

EMBEDDED BOARD AND METHOD OF MANUFACTURING THE SAME

CROSS-REFERENCE TO RELATED APPLICATION

This application claims the benefit of priority to Korean Patent Application No. 10-2014-0137636, filed on Oct. 13, 2014, of which is hereby incorporated by reference in its entirety into this application.

TECHNICAL FIELD

The present disclosure relates to an embedded circuit board and a method of manufacturing the embedded board.

BACKGROUND

A trend for multifunctional electronic devices including a cellular phone having lightweight, thin, short, and small electronic devices has never stopped. Further, there has been a demand for a technology of inserting electronic components, such as an integrated circuit (I/C), a semiconductor chip, or an active device, and a passive device, into a circuit board. Recently, a technology of embedding a component in the circuit board in various ways has been developed.

A general component embedded circuit board has a cavity in an insulating layer of the board and inserts electronic components such as an IC and a semiconductor chip in the cavity. Thereafter, adhesive resin such as a prepreg is coated on an inner portion of the cavity, and the insulating layer into which the electronic components are inserted. Then, the electronic components are fixed by coating the adhesive resin, and the insulating layer is formed.

SUMMARY

An aspect of the present inventive concept provides an embedded circuit board capable of being thinned and a method of manufacturing the embedded board.

Another aspect of the present inventive concept provides an embedded board of which signal transmission reliability is improved and a method of manufacturing the embedded board.

According to an embodiment of the present inventive concept, an embedded board may include an insulating layer; an electronic device embedded in the insulating layer; a first circuit pattern embedded in a bottom surface of the insulating layer; a second circuit pattern protruding from the bottom surface of the insulating layer; and a via bonded to the device and the second circuit pattern.

The first circuit pattern and the second circuit pattern may be bonded to each other.

A part of the second circuit pattern may be positioned on a bottom surface of the first circuit pattern.

According to another embodiment of the present inventive concept, a method of manufacturing an embedded board may include forming a first circuit pattern on a carrier board; forming a first insulating layer in which a cavity is formed on a top portion of the carrier board; placing an electronic device in the cavity; forming a second insulating layer on a top portion of the first insulating layer and embedding the electronic device; removing the carrier board; and forming a second circuit pattern, which protrudes from a bottom surface of the second insulating layer, and bonding a via to the device and the second circuit pattern.

The step of forming the second circuit pattern and the via may include bonding the second circuit pattern to the first circuit pattern.

A part of the second circuit pattern may be formed on a bottom surface of the first circuit pattern.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
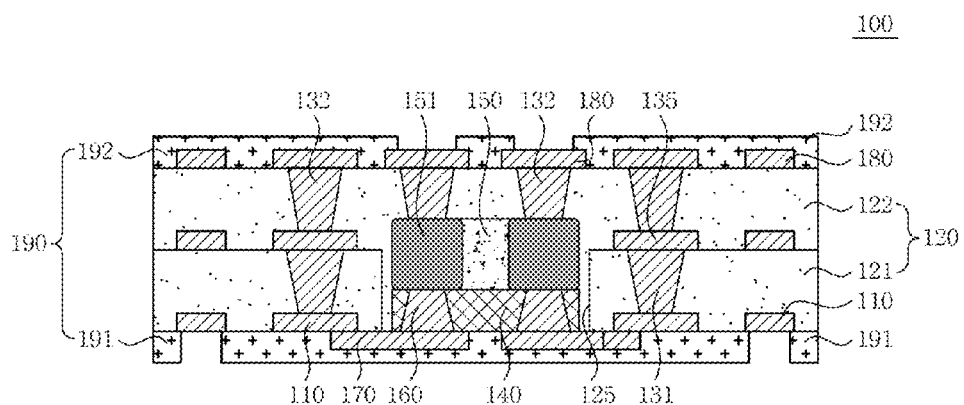
FIG. 1 is an exemplary diagram showing an embedded board according to an exemplary embodiment of the present inventive concept.

The objects, features, and advantages of the present inventive concept will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present inventive concept will be described in detail with reference to the accompanying drawings.

FIG. 1 is an exemplary diagram showing an embedded board according to an exemplary embodiment of the present inventive concept.

Referring to FIG. 1, an embedded circuit board 100 according to an exemplary embodiment of the present inventive concept includes an insulating layer 120, an electronic device 150, a first circuit pattern 110, a second circuit pattern 170, a bonding layer 140, a via 160, an inner circuit pattern 135, a first inner via 131, a second inner via 132, a third circuit pattern 180, and a protection layer 190.

According to an exemplary embodiment of the present inventive concept, the insulating layer 120 includes a first insulating layer 121 and a second insulating layer 122. According to an exemplary embodiment of the present disclosure, the second insulating layer 122 is formed on a top portion of the first insulating layer 121. The first insulating layer 121 includes a cavity 125 having a penetration structure. The second insulating layer 122 fills the cavity 125.

According to an exemplary embodiment of the present inventive concept, the first insulating layer 121 and the second insulating layer 122 are formed of complex polymer resin usually used as an interlayer insulating material. For example, the first insulating layer 121 and the second insulating layer 122 may be formed of epoxy based resin such as prepreg, ajinomotobuild up film (ABF), flame retardant 4 (FR4), bismaleimidetriazine (BT), etc. However, the materials forming the first insulating layer 121 and the second insulating layer 122 in the exemplary embodiment of the present inventive concept are not limited as described above. The first insulating layer 121 and the second insulating layer 122 according to the exemplary embodiment of the present inventive concept may be formed by selecting an insulating material known in a circuit board field. The first insulating layer 121 and the second insulating layer 122 may be formed of the same insulating material but may be formed of different insulating materials.

According to an exemplary embodiment of the present inventive concept, the device 150 is disposed in the cavity 125 of the first insulating layer 121. That is, the device 150 is embedded in the second insulating layer 122 filling the cavity 125 of the first insulating layer 121. For example, the device 150 is a multi-layer ceramic capacitor (MLCC). However, a type of the device 150 is not limited to the MLCC. Any types of the device 150 used in the circuit board field that may be mounted on or embedded in a circuit board may be possible.

According to an exemplary embodiment of the present inventive concept, the first circuit pattern 110 is embedded in the first insulating layer 121. A bottom surface of the first circuit pattern 110 buried in the first insulating layer 121 is exposed to a bottom surface of the first insulating layer 121. According to an exemplary embodiment of the present inventive concept, the first circuit pattern 110 is formed of copper. However, a material of the first circuit pattern 110 is not limited to copper. Any conductive materials used in the circuit board field may be possible as the material of the first circuit pattern 110.

According to an exemplary embodiment of the present inventive concept, the first circuit pattern 110 has a structure in which the first circuit pattern 110 is buried in the first insulating layer 121 and implements a fine pattern.

According to an exemplary embodiment of the present inventive concept, the second circuit pattern 170 is formed in bottom portions of the first insulating layer 121 and the second insulating layer 122. That is, the second circuit pattern 170 is formed in a bottom portion of the device 150 and is formed in the bottom surface of the second insulating layer 122 in which the device 150 is buried therein. The second circuit pattern 170 protrudes from the bottom surface of the second insulating layer 122 to outside. According to the present disclosure, the second circuit pattern 170 is bonded to the first circuit pattern 110 which is buried in the first insulating layer 121. For example, a part of the second circuit pattern 170 is positioned in the bottom surface of and bonded to the first circuit pattern 110. Thus, the first circuit pattern 110 and the second circuit pattern 170 are electrically connected to each other. According to the present disclosure, the second circuit pattern 170 is formed of copper. However, a material of the second circuit pattern 170 is not limited to copper. Any conductive materials used in the circuit board field may be possible as the material of the second circuit pattern 170.

According to an exemplary embodiment of the present inventive concept, the bonding layer 140 is formed between the device 150 and the second circuit pattern 170. The bonding layer 140 fixes the device 150 to the cavity 125. The bonding layer 140 according to the present disclosure may be formed of any adhesives used in the circuit board field. The bonding layer 140 according to the present disclosure is formed of a non-conductive material such as epoxy resin. According to an exemplary embodiment of the present inventive concept, the bonding layer 140 formed between the device 150 and the second circuit pattern 170 may be omitted according to a selection of one of ordinary skill in the art.

According to an exemplary embodiment of the present inventive concept, the via 160 penetrates through the bonding layer 140. However, when the bonding layer 140 is omitted, the via 160 penetrates through the second insulating layer 122 formed in a bottom portion of the device 150. According to the present disclosure, the via 160 is bonded to an electrode 151 of the device 150 and the second circuit pattern 170. Thus, the device 150 and the second circuit pattern 170 are electrically connected to each other by the via 160. According to the present disclosure, the via 160 is formed of copper. However, a material of the via 160 is not limited to copper. Any conductive materials used in the circuit board field may be possible as the material of the via 160.

According to an exemplary embodiment of the present inventive concept, the first circuit pattern 110 and the second circuit pattern 170 are electrically, directly connected to each other. Thus, reliability of signal transmission between the first circuit pattern 110 and the second circuit pattern 170 is improved. Accordingly, reliability of signal transmission between the device 150 and the first circuit pattern 110 is improved.

According to an exemplary embodiment of the present inventive concept, the inner circuit pattern 135 is formed on a top portion of the first insulating layer 121. The inner circuit pattern 135 is formed as one layer in FIG. 1. However, the inner circuit pattern 135 is not necessarily formed as one layer. The inner circuit pattern 135 may be formed as multiple layers according to a selection of one of ordinary skill in the art. In this regard, if the inner circuit pattern 135 is formed as multiple layers, an inner insulating layer (not shown) may be further formed between the inner circuit pattern 135 of multiple layers. A via (not shown) may be further formed in the inner insulating layer (not shown) and may be electrically connected to the inner circuit pattern 135 which is formed on different layers.

According to an exemplary embodiment of the present inventive concept, the first inner via 131 penetrates through the first insulating layer 121. The first inner via 131 is bonded to the inner circuit pattern 135 and the first circuit pattern 110. Thus, the inner circuit pattern 135 and the first circuit pattern 110 are electrically connected to each other by the first inner via 131.

According to an exemplary embodiment of the present inventive concept, the third circuit pattern 180 is formed on a top portion of the second insulating layer 122. The third circuit pattern 180 protrudes from a top surface of the second insulating layer 122.

According to an exemplary embodiment of the present inventive concept, the second inner via 132 is formed to penetrate through the second insulating layer 122. The second inner via 132 is bonded to the third circuit pattern 180 and the inner circuit pattern 135. Thus, the third circuit pattern 180 and the inner circuit pattern 135 are electrically connected to each other by the second inner via 132. The second inner via 132 may be bonded to the third circuit pattern 180 and an electrode of the device 150. Thus, the third circuit pattern 180 and the device 150 are electrically connected to each other by the second inner via 132.

According to an exemplary embodiment of the present inventive concept, the inner circuit pattern 135, the first inner via 131, the second inner via 132, and the third circuit pattern 180 are formed of copper. However, materials of the inner circuit pattern 135, the first inner via 131, the second inner via 132, and the third circuit pattern 180 are not limited to copper. Any conductive materials used in the circuit board field may be possible as the materials of the inner circuit pattern 135, the first inner via 131, the second inner via 132, and the third circuit pattern 180.

According to an exemplary embodiment of the present inventive concept, the protection layer 190 includes a first protection layer 191 and a second protection layer 192. The first protection layer 191 is formed on a bottom portion of the first insulating layer 121 and protects the first circuit pattern 110 and the second circuit pattern 170. The second protection layer 192 is formed on a top portion of the second insulating layer 122 and is formed to protect the third circuit pattern 180.

When soldering an electrical connection to an external component, the first protection layer 191 and the second protection layer 192 according to the present disclosure prevent solder from being coated on the first circuit pattern 110, the second circuit pattern 170, and the third circuit pattern 180. The first protection layer 191 and the second protection layer 192 prevent the first circuit pattern 110, the second circuit pattern 170, and the third circuit pattern 180 from being oxidized and corroded.

According to an exemplary embodiment of the present inventive concept, the first protection layer 191 allows a portion electrically connected to the external component to be exposed to the outside. For example, when a part of the first circuit pattern 110 is electrically connected to the external component, the first protection layer 191 exposes the corresponding first circuit pattern 110 to the outside.

According to the present inventive concept, when a part of the third circuit pattern 180 is electrically connected to the external component, the second protection layer 192 allows the corresponding third circuit pattern 180 to be exposed to the outside.

Here, the first protection layer 191 and the second protection layer 192 are formed of a heat resistant sheath material. For example, the first protection layer 191 and the second protection layer 192 may be formed of a solder resist.

Figure 2:
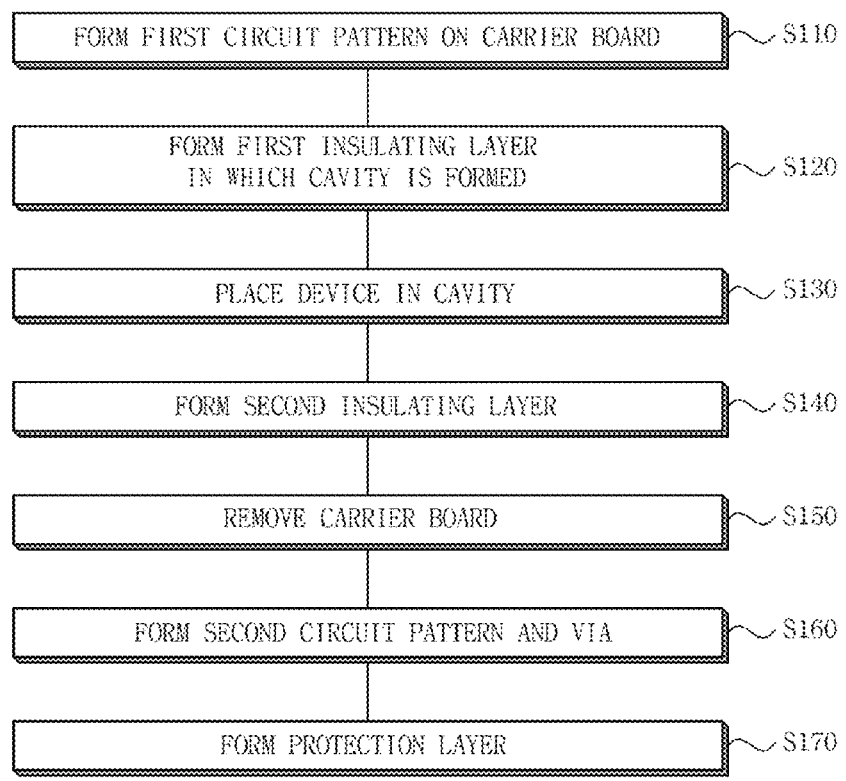
FIG. 2 is a flowchart of a method of manufacturing the embedded board according to an exemplary embodiment of the present inventive concept
Figure 3:
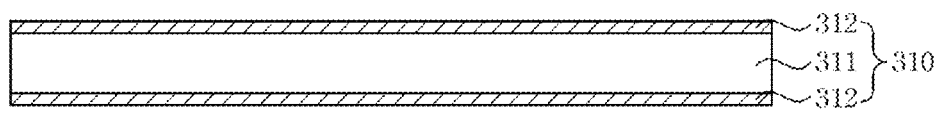
FIGS. 3 through 17 are exemplary diagrams for describing a method of manufacturing an embedded board according to an exemplary embodiment of the present inventive concept.

FIG. 2 is a flowchart of a method of manufacturing an embedded board according to an exemplary embodiment of the present inventive concept. FIGS. 3 through 17 are exemplary diagrams for describing a method of manufacturing the embedded board according to an exemplary embodiment of the present inventive concept.

The flowchart of FIG. 2 is described with reference to FIGS. 3 through 17.

The first circuit pattern 110 is formed on a carrier board 310 (S110).

The carrier board 310 is an element for supporting an insulating layer and a circuit layer when the insulating layer and the circuit layer for a package board are formed. According to the present disclosure, the carrier board 310 includes a carrier metal layer 312 stacked on a carrier core 311.

For example, the carrier core 311 is formed of an insulating material. However, a material of the carrier core 311 is not limited to the insulating material, and may have a structure in which a metal material or the insulating layer and a metal layer of one or more layers are stacked. Further, the carrier metal layer 312 is formed of copper (Cu). However, a material of the carrier metal layer 312 is not limited to copper (Cu). A conductive material used in a circuit board field may be applied without restriction.

Here, a top portion of the carrier board 310 is described as an example. In this regard, although a description is omitted, the embedded board may be manufactured by using a bottom portion of the carrier board 310 through the same process.

Figure 4:
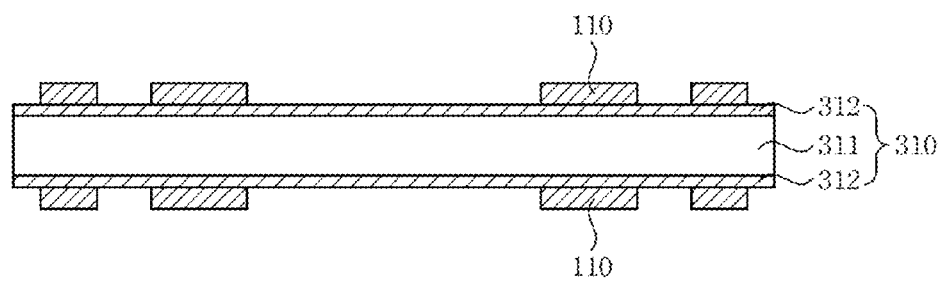

Referring to FIG. 4, the first circuit pattern 110 is formed on the top portion of the carrier board 310.

According to an exemplary embodiment of the present inventive concept, the first circuit pattern 110 is formed on a top portion of the carrier metal layer 312. The first circuit pattern 110 is formed by using a circuit pattern forming method used in the circuit board field such as a tenting process, a semi-additive process (SAP), a modify semi-additive process (MSAP), etc. The first circuit pattern 110 is formed of a conductive material. For example, the first circuit pattern 110 is formed of copper. However, a material of the first circuit pattern 110 is not limited to copper. A conductive material used in the circuit board field may be applied without restriction.

According to an exemplary embodiment of the present inventive concept, the first circuit pattern 110 is formed in a region in which a cavity (not shown) is not formed. However, the region in which the first circuit pattern 110 is formed is not limited thereto. That is, the first circuit pattern 110 may be formed in a region in which the cavity (not shown) is formed later according to a selection of one of ordinary skill in the art.

Thereafter, the first insulating layer 121, in which the cavity 125 is formed, is formed (S120).

Figure 5:
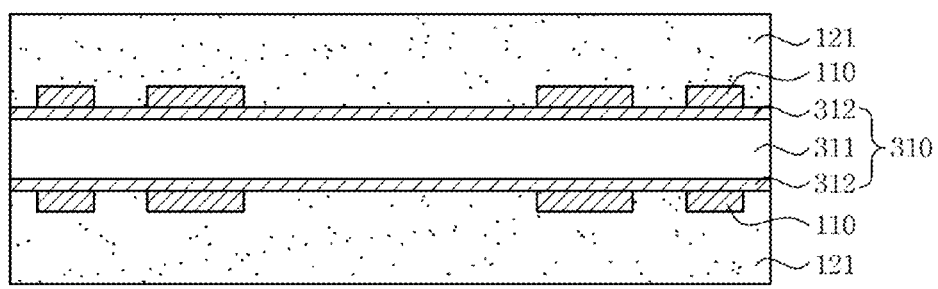
Figure 6:
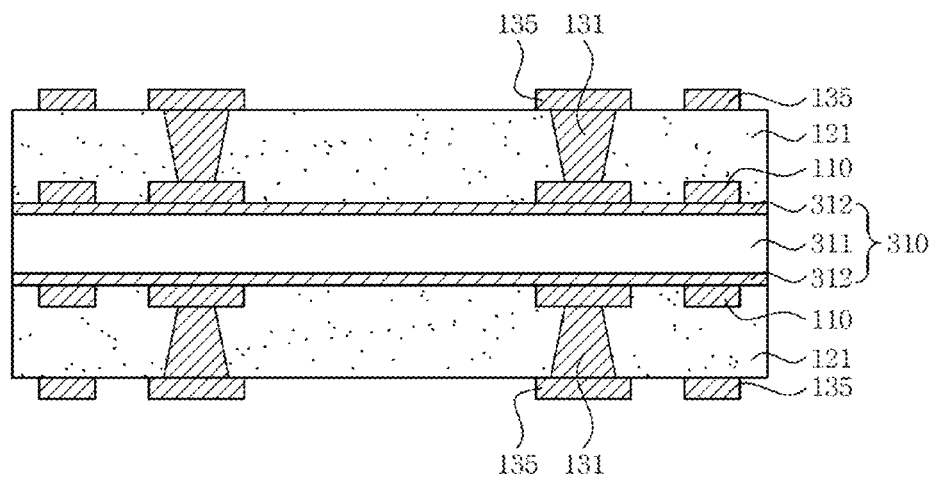

Referring to FIG. 5, the first insulating layer 121 is formed on the carrier board 310. For example, the first insulating layer 121 may be formed using pressurization and heating after being laminated on the top portion of the carrier metal layer 312 in the form of a film. Alternatively, the first insulating layer 121 may be formed by being coated on top portions of the carrier metal layer 312 and the first circuit pattern 110 in the form of a liquid. The above-formed first insulating layer 121 buries the first circuit pattern 110.

According to an exemplary embodiment of the present inventive concept, the first insulating layer 121 may be formed by using not only the above-described method but also any methods of forming an insulating layer in the circuit board field.

The first insulating layer 121 according to an exemplary embodiment of the present disclosure is formed of complex polymer resin usually used as an interlayer insulating material. For example, the first insulating layer 121 may be formed of epoxy based resin such as prepreg, ajinomotobuild up film (ABF), flame retardant 4 (FR4), bismaleimidetriazine (BT), etc. However, the material forming the first insulating layer 121 in the present disclosure is not limited as described above. The first insulating layer 121 may be formed by selecting an insulating material known in the circuit board field.

According to the present disclosure, the inner circuit pattern 135 is formed on the top portion of the first insulating layer 121. Here, the inner circuit pattern 135 may be formed by using any circuit pattern forming methods used in the circuit board field. The inner circuit pattern 135 is formed of the conductive material. For example, the inner circuit pattern 135 is formed of copper.

The first inner via 131 may be formed inside the first insulating layer 121 and penetrate through the first insulating layer 121 to electrically connect the first circuit pattern 110 and the inner circuit pattern 135.

According to an exemplary embodiment of the present inventive concept, the first inner via 131 is formed by using a via forming method used in the circuit board field. For example, the first inner via 131 is formed after forming a first inner via hole (not shown) penetrating through the first insulating layer 121 and by filling the first inner via hole (not shown) with the conductive material. The first inner via 131 may be formed of the conductive material as generally used in the circuit board field such as copper.

According to an exemplary embodiment of the present inventive concept, inner circuit pattern 135 and the first inner via 131 may be simultaneously formed. Alternatively, after forming the first inner via 131, the inner circuit pattern 135 may be formed on a top portion of the first inner via 131.

In the present disclosure, forming of the inner circuit pattern 135 as one layer is described as the example. However, the inner circuit pattern 135 is not necessarily formed as only one layer. That is, the inner circuit pattern 135 may be formed as multi layers according to a selection of one of ordinary skill in the art. In this regard, if the inner circuit pattern 135 is formed as multi layers, an insulating layer (not shown) of one or more layers may be formed between the first insulating layer 121 and the inner circuit pattern 135 of multi layers. A via (not shown) electrically connecting the inner circuit pattern 135 of multi layers may be formed.

Figure 7:
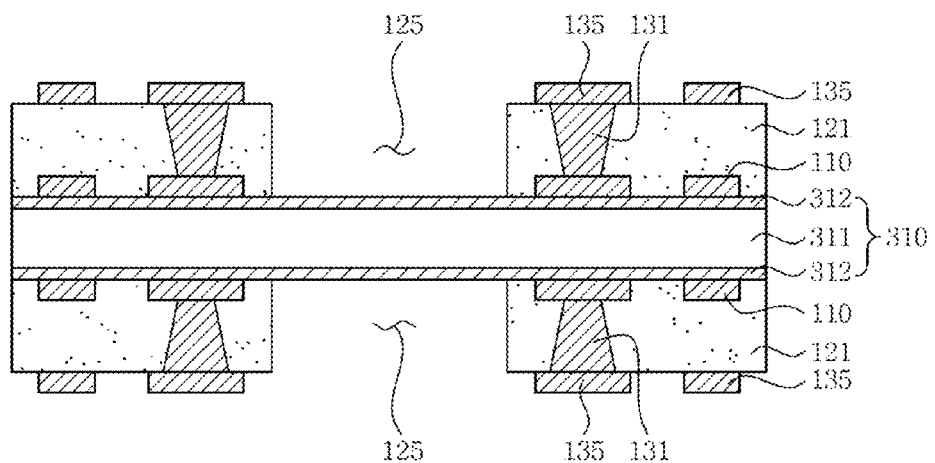

Referring to FIG. 7, the cavity 125 is formed by laser drilling the first insulating layer 121. Here, the cavity 125 is formed by laser drilling but is not limited thereto. That is, the cavity 125 may be formed by using any methods of processing an insulating material known in the circuit board field. The cavity 125 may penetrate through the first insulating layer 121, and a part of the carrier metal layer 312 is exposed to outside through the above-formed cavity 125.

Then, the device 150 is disposed in the cavity 125 (S130).

Figure 8:
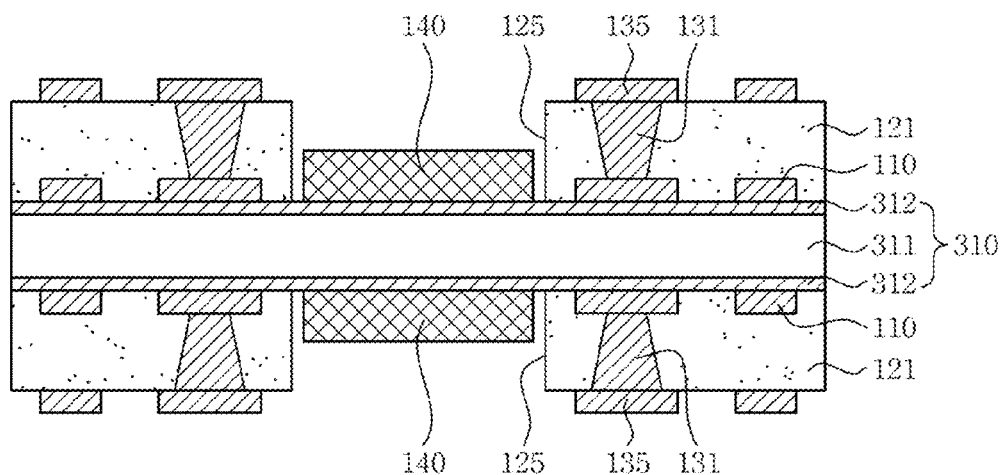

Referring to FIG. 8, the bonding layer 140 is formed on a top portion of the carrier metal layer 312 exposed by the cavity 125.

According to the present disclosure, when an electronic device is to be mounted, the bonding layer 140 allows the device to be fixed to the cavity 125. The bonding layer 140 according to the present disclosure may be formed of any adhesives used in the circuit board field and may be formed of a non-conductive material such as epoxy resin.

Figure 9:
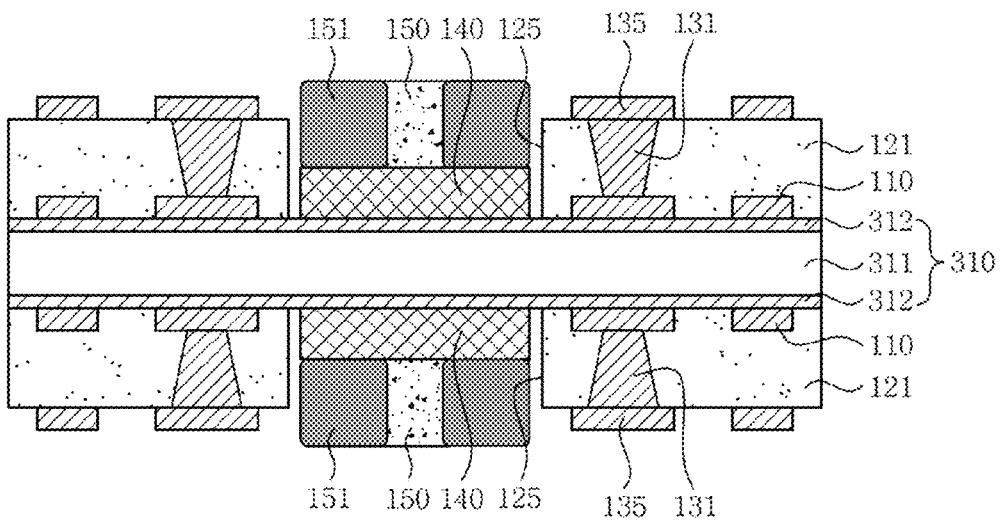

Referring to FIG. 9, the device 150 is mounted on a top portion of the bonding layer 140 and is disposed in the cavity 125.

The device 150 according to the present disclosure is an MLCC in which the electrode 151 is formed on both surfaces. However, a type of the device 150 is not limited to the MLCC. Any types of the device 150 used in the circuit board field that may be mounted on or embedded in a circuit board may be possible. The device 150 may be fixed to the cavity 125 by the bonding layer 140.

Thereafter, the second insulating layer 122 is formed (S140).

Figure 10:
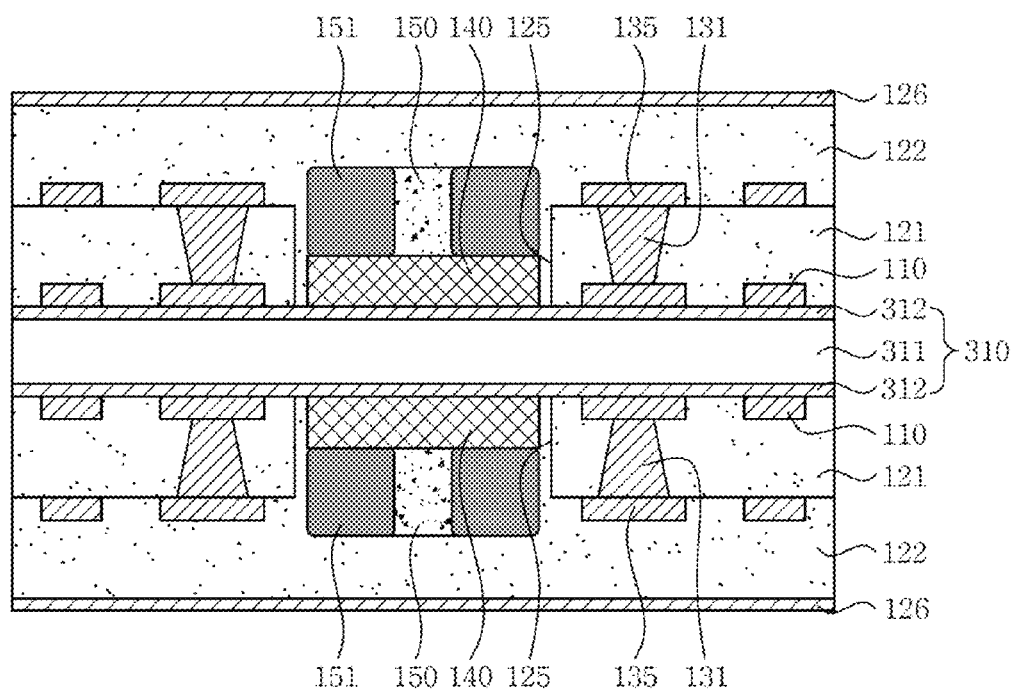

Referring to FIG. 10, the second insulating layer 122 is formed on the top portion of the first insulating layer 121. The second insulating layer 122 is formed to fill the cavity 125 of the first insulating layer 121 in which the device 150 is disposed. Thus, the second insulating layer 122 buries the device 150 disposed in the cavity 125.

The second insulating layer 122 may be formed by pressurization and heating after being laminated on the top portion of the first insulating layer 121 in the form of a film. Alternatively, the second insulating layer 122 may be formed by being coated on the top portion of the first insulating layer 121 and the cavity 125 in the form of a liquid.

The second insulating layer 122 according to the present disclosure may be formed by using not only the above-described method but also any methods of forming an insulating layer in the circuit board field. The second insulating layer 122 may be formed of complex polymer resin usually used as an interlayer insulating material. For example, the second insulating layer 122 may be formed of epoxy based resin such as prepreg, ABF, FR4, BT, etc. However, the material forming the second insulating layer 122 in the present disclosure is not limited as described above. The second insulating layer 122 may be formed by selecting an insulating material known in the circuit board field.

According to an exemplary embodiment, the metal layer 126 is formed on the top portion of the second insulating layer 122. The metal layer 126 may be omitted according to a selection of one of ordinary skill in the art.

The carrier board 310 is then removed (S150).

Figure 11:
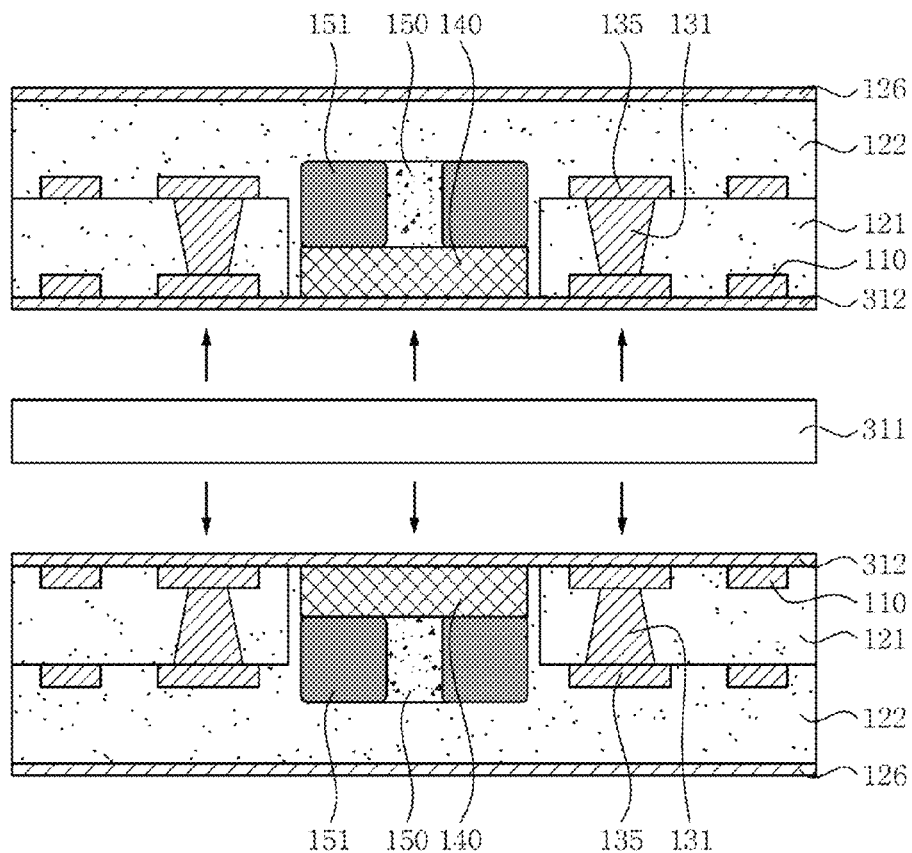

Referring to FIG. 11, the carrier core 311 is removed by separating the carrier core 311 and the carrier metal layer 312 from each other. The carrier metal layer 312 may be remained in contact with the bottom portion of the first insulating layer 121 and form a circuit pattern. Alternatively, the carrier metal layer 312 may be removed after removing the carrier core 311.

Thereafter, the second circuit pattern 170 and the via 160 are formed (S160).

Figure 12:
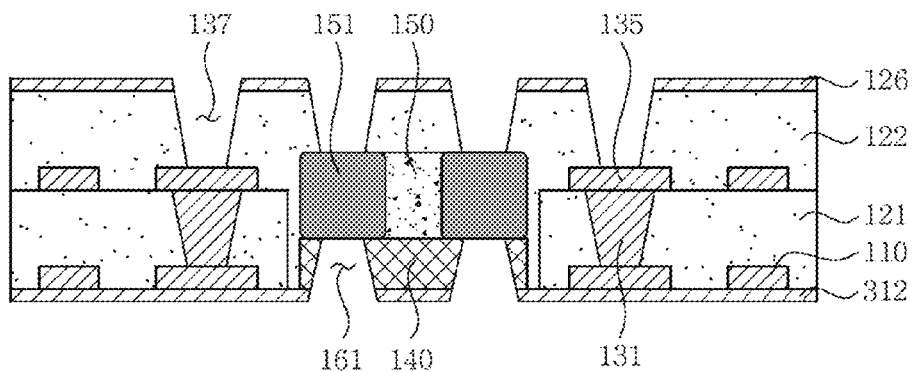

Referring to FIG. 12, a via hole 161 is formed to penetrate through the bonding layer 140 formed in the carrier metal layer 312 and the cavity 125 and allows the electrode 151 of the device 150 to be exposed to the outside. If the bonding layer 140 is omitted, the via hole 161 is formed to penetrate through the second insulating layer 122 in the bottom portion of the device 150. The via hole 161 may be formed by using any method of processing the insulating material known in the circuit board field such as laser drill processing, etc.

According to the present disclosure, when the via hole 161 is formed, a second inner via hole 137 may also be formed in the second insulating layer 122 in a top portion of the device 150. However, the second inner via hole 137 is not necessarily formed simultaneously with or by using the same method as that of the via hole 161.

The second inner via hole 137 may penetrate through the metal layer 126 and the second insulating layer 122. The above-formed second inner via hole 137 allows the inner circuit pattern 135 to be exposed to the outside. The second inner via hole 137 is formed to allow the electrode 151 of the device 150 to be exposed to the outside.

Figure 13:
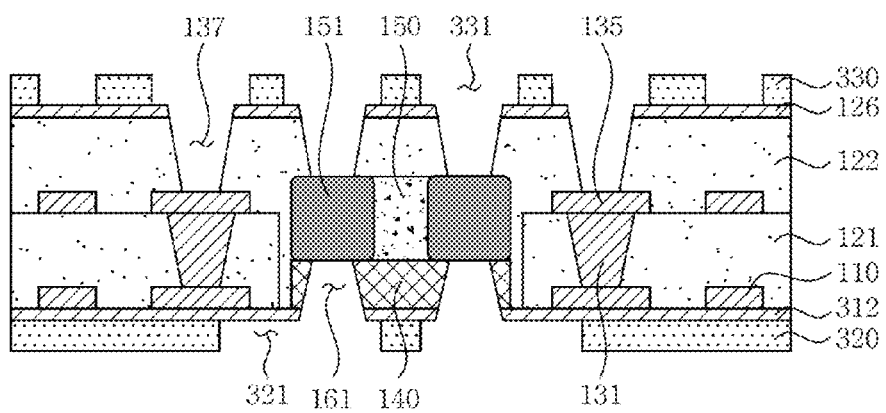

Referring to FIG. 13, a first plating resist 320 is formed in the bottom portion of the carrier metal layer 312 and includes a first plating opening unit 321. The first plating opening unit 321 allows the via hole 161 to be exposed to the outside. The first plating opening unit 321 allows the carrier metal layer 312 of a region in which a second circuit pattern, which is to be formed, to be exposed to the outside.

A second plating resist 330 is formed on the top portion of the metal layer 126. According to an exemplary embodiment of the present inventive concept, the second plating resist 330 includes a second plating opening unit 331 which allows the second inner via hole 137 to be exposed to the outside. The second plating opening unit 331 allows the metal layer 126 of a region in which a third circuit pattern, which is to be formed, to be exposed to the outside.

Figure 14:
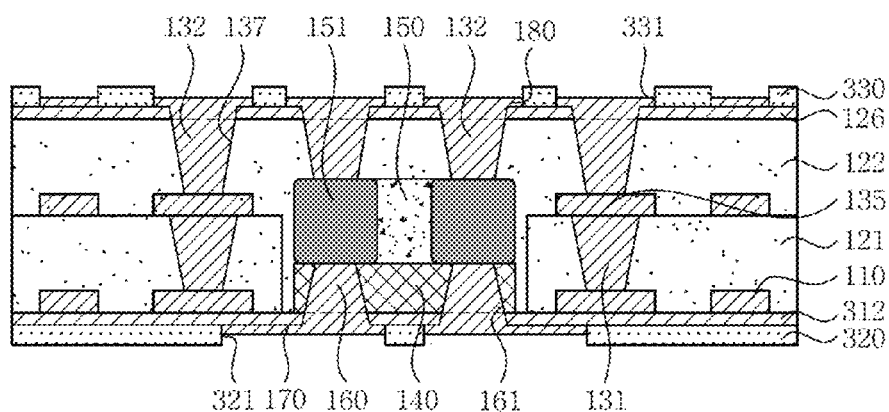

Referring to FIG. 14, the via 160, the second circuit pattern 170, the second inner via 132, and the third circuit pattern 180 are formed.

According to an exemplary embodiment of the present inventive concept, a region exposed to the outside by the first plating resist 320 and the second plating resist 330 is plated with the conductive material used in the circuit board field.

The via 160 may be formed by plating the via hole 161 with the conductive material. The second inner via 132 is formed by plating the second inner via hole 137 with the conductive material. Thus, the via 160 penetrates through the second insulating layer 122 or the bonding layer 140 in the bottom portion of the device 150 to be bonded to the device 150. The second inner via 132 penetrates through the second insulating layer 122 in the top portion of the device 150 to be bonded to the inner circuit pattern 135 and the device 150.

The second circuit pattern 170 may be formed in the bottom portions of the first insulating layer 121 and the second insulating layer 122 exposed to the outside by the first plating opening unit 321. In this regard, the second circuit pattern 170 includes the carrier metal layer 312 exposed to the outside by the first plating opening unit 321.

The third circuit pattern 180 may be formed in the top portion of the second insulating layer 122 exposed to the outside by the second plating opening unit 331. In this regard, the third circuit pattern 180 includes the metal layer 126 exposed to the outside by the second plating opening unit 331.

The second circuit pattern 170 may be formed to be bonded to the bottom surface of the via 160 and electrically connected to the via 160. The third circuit pattern 180 is bonded to the top surface of the second inner via 132 and is electrically connected to the second inner via 132.

That is, according to an exemplary embodiment of the present inventive concept, the via 160 electrically connects the device 150 and the second circuit pattern 170. The second inner via 132 electrically connects the inner circuit pattern 135 and the device 150 and the third circuit pattern 180.

Further, the second circuit pattern 170 may protrude from the bottom surfaces of the first insulating layer 121 and the second insulating layer 122. That is, the second circuit pattern 170 is formed in the bottom portion of the device 150 and is formed in a bottom surface of the second insulating layer 122 burying the device 150. The second circuit pattern 170 having a protrusion structure is bonded to the first circuit pattern 110 buried in the first insulating layer 121. For example, a part of the second circuit pattern 170 is disposed in the bottom surface of the first circuit pattern 110 and is bonded to the first circuit pattern 110. Thus, the first circuit pattern 110 and the second circuit pattern 170 are electrically connected to each other. The device 150 and the first circuit pattern 110 are electrically connected to each other by the above-formed via 160 and the second circuit pattern 170. Thus, reliability of a signal transmission between the first circuit pattern 110 and the second circuit pattern 170 is improved owing to a direct connection therebetween. In conclusion, the reliability of the signal transmission between the device 150 and the first circuit pattern 110 is also improved.

According to an exemplary embodiment of the present inventive concept, the third circuit pattern 180 is formed on the top portion of the second insulating layer 122. Thus, the third circuit pattern 180 protrudes from the top surface of the second insulating layer 122.

In the present disclosure, the second inner via 132 and the third circuit pattern 180 are formed with the via 160 and the second circuit pattern 170 as an example but are not necessarily limited thereto. That is, the second inner via 132 and the third circuit pattern 180 may be formed separately from the via 160 and the second circuit pattern 170 or may be formed by using different methods.

Figure 15:
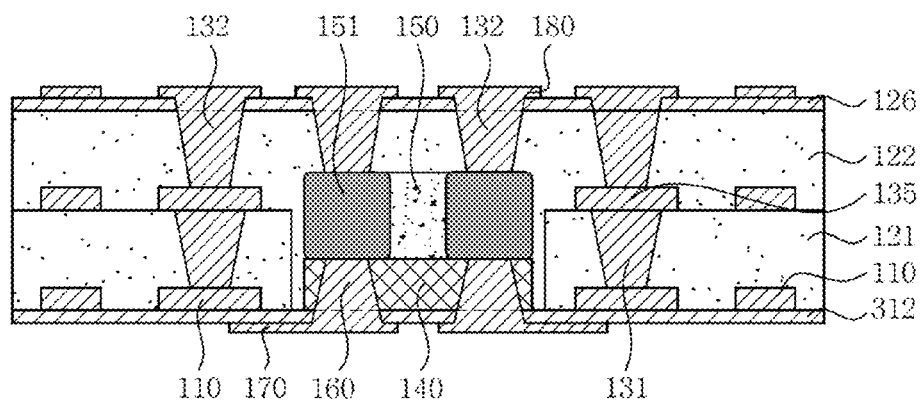
Figure 16:
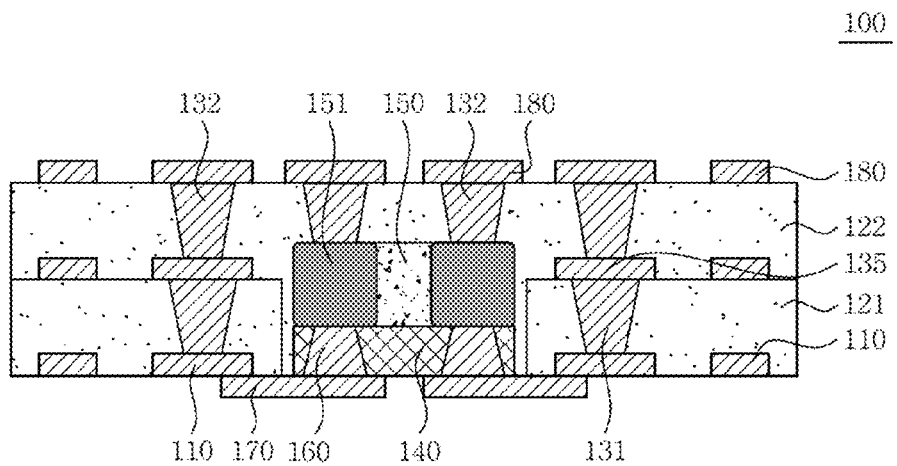

Referring to FIG. 15, a first plating resist (320 of FIG. 14) and a second plating resist (330 of FIG. 14) are removed, and in FIG. 16, a carrier metal layer (312 of FIG. 15) exposed to the outside and a metal layer (125 of FIG. 15) are removed.

FIG. 16 and subsequent figures illustrate a carrier metal layer (312 of FIG. 15) included in the second circuit pattern 170 without separating it for convenience of description. A metal layer (125 of FIG. 15) included in the third circuit pattern 180 is also illustrated without being separated. However, as described with reference to FIG. 14, the second circuit pattern 170 includes the carrier metal layer (312 of FIG. 15), and the third circuit pattern 180 includes the metal layer (125 of FIG. 15).

Thereafter, a protection layer is formed (S170).

Figure 17:
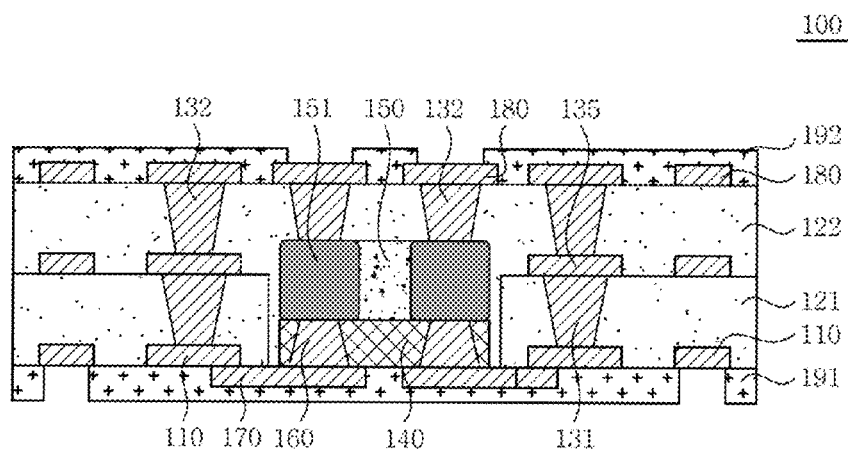

Referring to FIG. 17, the first protection layer 191 and the second protection layer 192 are formed.

The first protection layer 191 may be formed on the bottom portion of the first insulating layer 121 to protect the first circuit pattern 110 and the second circuit pattern 170. The second protection layer 192 may be formed on the top portion of the second insulating layer 122 to protect the third circuit pattern 180.

When soldering an electrical connection to an external component, the first protection layer 191 and the second protection layer 192 according to the present disclosure prevent solder from being coated on the first circuit pattern 110, the second circuit pattern 170, and the third circuit pattern 180. The first protection layer 191 and the second protection layer 192 prevent the first circuit pattern 110, the second circuit pattern 170, and the third circuit pattern 180 from being oxidized and corroded.

The first protection layer 191 may allow a region electrically connected to the external component to be exposed to the outside. For example, when a part of the first circuit pattern 110 is electrically connected to the external component, the first protection layer 191 allows the corresponding first circuit pattern 110 to be exposed to the outside.

When a part of the third circuit pattern 180 is electrically connected to the external component, the second protection layer 192 allows the corresponding third circuit pattern 180 to be exposed to the outside.

According to an exemplary embodiment of the present inventive concept, the first protection layer 191 and the second protection layer 192 are formed of a heat resistant sheath material. For example, the first protection layer 191 and the second protection layer 192 may be formed of a solder resist.

The embedded board 100 according to an exemplary embodiment of the present inventive concept of FIG. 1 is formed through FIGS. 2 through 17 described above.

The carrier board 310 is used to form the first circuit pattern 110 as a burying structure, thereby implementing a fine pattern. The carrier board 310 may implement the embedded board 100, and thus a separate core layer for embedding the device 150 can be omitted, thereby implementing a thin embedded board.

Figure 18:
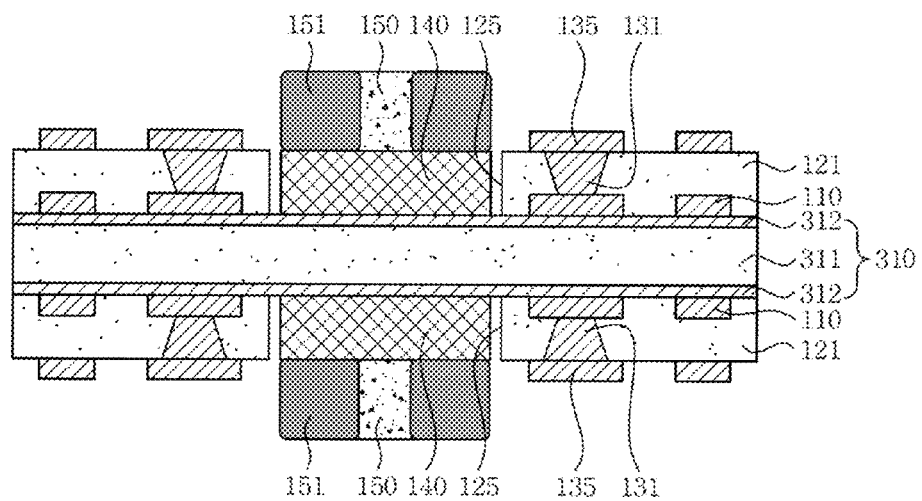
FIGS. 18 and 19 are exemplary diagrams for describing a method of manufacturing an embedded board according to another exemplary embodiment of the present inventive concept.
Figure 19:
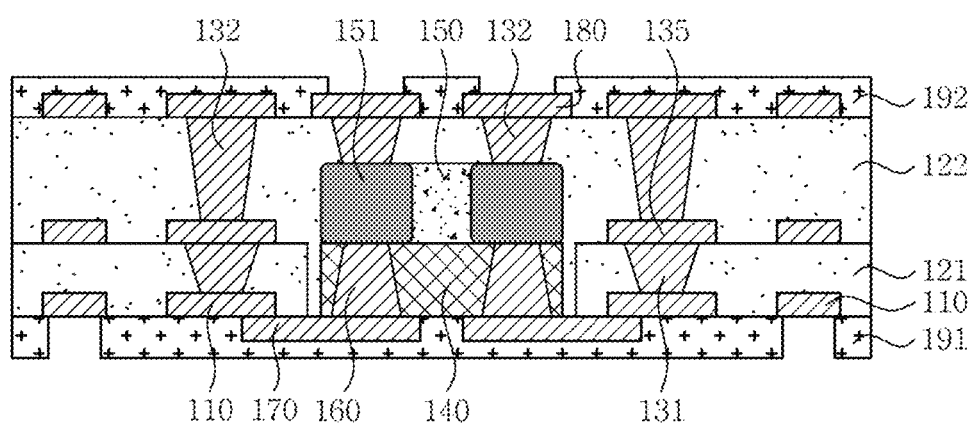

FIGS. 18 and 19 are exemplary diagrams for illustrating a method of manufacturing an embedded board according to another exemplary embodiment of the present inventive concept.

Referring to FIG. 19, a top surface of the first insulating layer 121 is disposed in both sides of the device 150. However, a thickness of the first insulating layer 121 is not limited thereto. Thickness of the first insulating layer 121 may be changed according to a selection of one of ordinary skill in the art.

For example, as shown in FIG. 18, the first insulating layer 121 may have a small thickness in such a manner that the top surface of the first insulating layer 121 may be positioned in a bottom portion of the device 150.

Thereafter, the embedded board 200 of FIG. 19 is formed by performing the process of FIGS. 10 through 17.

The above-formed embedded board 200 according to another exemplary embodiment may have a smaller thickness than that of the embedded board (100 of FIGS. 1 and 17) according to an exemplary embodiment of the present disclosure.

Although the embodiments of the present inventive concept have been disclosed for illustrative purposes, it will be appreciated that the present disclosure is not limited thereto, and those skilled in the art will appreciate that various modifications, additions, and substitutions are possible, without departing from the scope and spirit of the disclosure.

Accordingly, any and all modifications, variations, or equivalent arrangements should be considered to be within the scope of the disclosure, and the detailed scope of the disclosure will be disclosed by the accompanying claims.

What is claimed is:

1. An embedded circuit board comprising:
an insulating layer;
an electronic device embedded in the insulating layer;
a first circuit pattern embedded in the insulating layer to contact a bottom surface of the insulating layer;
a second circuit pattern protruding from the bottom surface of the insulating layer; and
a via bonded to the device and the second circuit pattern, wherein the first circuit pattern and the via are separated from each other.

2. The embedded board of claim 1, wherein the first circuit pattern and the second circuit pattern are bonded to each other.

3. The embedded board of claim 2, wherein a part of the second circuit pattern is in contact with a bottom surface of the first circuit pattern.

4. The embedded board of claim 1, further comprising: a third circuit pattern formed on a top surface of the insulating layer.

5. The embedded board of claim 1, further comprising: an inner circuit pattern formed in an inner portion of the insulating layer.

6. The embedded board of claim 1, further comprising: a bonding layer disposed between the device and the second circuit pattern.

7. The embedded board of claim 6, wherein the via penetrates through the bonding layer.

8. The embedded board of claim 1, wherein the insulating layer includes:
a first insulating layer having the first circuit pattern embedded therein and including a cavity in which the device is disposed; and
a second insulating layer disposed on a top portion of the first insulating layer to embed the device.

9. The embedded board of claim 1, further comprising: a protection layer disposed on a top portion and a bottom portion of the insulating layer, respectively, and protecting at least one of the first circuit pattern, the second circuit pattern, and a third circuit pattern.

10. The embedded board of claim 9, wherein the protection layer allows a part of the first circuit pattern and the third circuit pattern to be exposed to outside.

11. The embedded board of claim 1, wherein the electronic device includes an electrode at both surfaces thereof to which the via is bonded.

12. The embedded board of claim 9, wherein the via penetrates through the insulating layer disposed under a bottom portion of the electronic device.

13. The embedded board of claim 5, further comprising: an inner via penetrating through the insulating layer and bonded between the inner circuit pattern and the first circuit pattern.

14. A method of manufacturing an embedded board, the method comprising:
forming a first circuit pattern on a carrier board;
forming a first insulating layer in which a cavity is formed on a top portion of the carrier board;
placing an electronic device in the cavity;
forming a second insulating layer on a top portion of the first insulating layer and embedding the electronic device;
removing the carrier board; and
forming a second circuit pattern which protrudes from a bottom surface of the second insulating layer formed in the cavity and bonding a via to the electronic device and the second circuit pattern,
wherein the first circuit pattern and the via are separated from each other.

15. The method of claim 14, wherein the step of forming the first insulating layer includes forming an inner circuit pattern on the top portion of the first insulating layer.

16. The method of claim 14, wherein the step of forming the second circuit pattern and the via includes bonding the second circuit pattern to the first circuit pattern.

17. The method of claim 16, wherein a part of the second circuit pattern is in contact with a bottom surface of the first circuit pattern.

18. The method of claim 14, wherein the step of forming the second circuit pattern includes forming a third circuit pattern on a top surface of the second insulating layer.

19. The method of claim 14, further comprising: before the step of placing the electronic device, forming a bonding layer on the top portion of the carrier board exposed by the cavity.

20. The method of claim 19, wherein the step of forming the second circuit pattern includes forming the via to penetrate through the bonding layer.

21. The method of claim 14, further comprising: after the step of forming the second circuit pattern and the via, forming a protection layer protecting at least one of the first circuit pattern, the second circuit pattern, and a third circuit pattern in a bottom portion of the first insulating layer and a top portion of the second insulating layer.

22. The method of claim 19, wherein the step of forming the second circuit pattern includes forming a via hole to penetrate through the bonding layer and forming an inner via hole in the second insulating layer to penetrate through a metal layer which is formed on a top portion of the second insulating layer.

23. The method of claim 22, wherein the step of forming the second circuit pattern further includes forming a first plating resist on a bottom portion of the carrier board and a second plating resist on a top portion of the metal layer.

24. The method of claim 23, wherein the first plating resist includes a first plating opening unit allows the via hole to be exposed to outside and the second plating resist includes a second plating opening unit allows the second inner via hole to be exposed to the outside.

25. The method of claim 24, wherein the via is formed by plating the via hole to penetrate through the bonding layer, and a second inner via is formed by plating the second inner via hole.

26. The method of claim 24, wherein the step of forming the second circuit pattern further includes removing the first plating resist, the second plating resist and the metal layer.

27. The method of claim 14, wherein the carrier board includes:
   a carrier metal layer on which the first circuit pattern and the first insulating layer are formed in the form of a liquid and a film, respectively; and
   a carrier core on which the carrier metal layer is stacked on.

\* \* \* \* \*